United States Patent [19]

Lueker et al.

[11] Patent Number: 5,252,977
[45] Date of Patent: Oct. 12, 1993

[54] DIGITAL PULSE GENERATOR USING DIGITAL SLIVERS AND ANALOG VERNIER INCREMENTS

[75] Inventors: Jonathan Lueker, Portland; John Hengeveld, Aloha; Brad Needham, Hillsboro; Burt Price, Portland; Jim Schlegel; Mehrab Sedeh, both of Beaverton, all of Oreg.

[73] Assignee: Tektronix, Inc., Wilsonville, Oreg.

[21] Appl. No.: 848,609

[22] Filed: Mar. 9, 1992

Related U.S. Application Data

[62] Division of Ser. No. 606,387, Oct. 31, 1990, Pat. No. 5,208,598.

[51] Int. Cl.$^5$ .......................... H03K 5/04; H03K 5/13
[52] U.S. Cl. .................... 341/182; 307/239; 307/265; 307/269; 341/173; 341/178; 364/718
[58] Field of Search ............... 341/177, 178, 179, 182, 341/183, 147, 140, 173, 180; 307/234, 510, 590, 265, 266, 267, 268, 269; 375/110; 364/718, 486, 719; 377/42, 49, 56

[56] References Cited

U.S. PATENT DOCUMENTS

| | | | |
|---|---|---|---|
| 4,667,302 | 5/1987 | Mackey et al. | 364/718 |
| 4,680,479 | 7/1987 | Alonso | 307/234 |
| 4,791,384 | 12/1988 | Mackey et al. | 364/718 |

Primary Examiner—Donald J. Yusko
Assistant Examiner—John Giust
Attorney, Agent, or Firm—John Smith-Hill; Boulden G. Griffith; Francis I. Gray

[57] ABSTRACT

A digital architecture for a pulse generator includes a triggerable voltage controlled oscillator (VCO) with two alternative sources of frequency control voltage, an internal DAC or a phase frequency comparison with an external timebase. In a top octave of operation, the output of the triggerable VCO is used to produce output pulses whose edge locations are then adjusted by small digital increments or "slivers" and very small analog increments or "verniers". In lower octaves of operation, the contents of a pattern RAM serve to frequency divide the triggerable VCO output frequency by powers of two. The RAM contents are converted to a serial bit stream that imposes the coarse pulse width and period as an integral number of top octave periods, or quanta. The edge locations are then adjusted with slivers and verniers, as in the top octave. Automatic calibration facilities are included. This architecture provides controllable tolerances, permits accurate positioning of a trigger out signal relative to any pulse produced, allows the user to specify the trailing edge timing directly, and permits both pulse width and phase to be specified as a percentage of the overall period and automatically kept proportional when the frequency is varied. It allows synchronized operation of different channels at rates related by powers-of-two, and permits disabling of a channel at an operator determined voltage level. A means for determining, by the use of an external signal, when bursts of pulses synchronized to an external frequency source will begin, is also provided.

10 Claims, 10 Drawing Sheets

USE OF SLIVERS AND VERNIERS

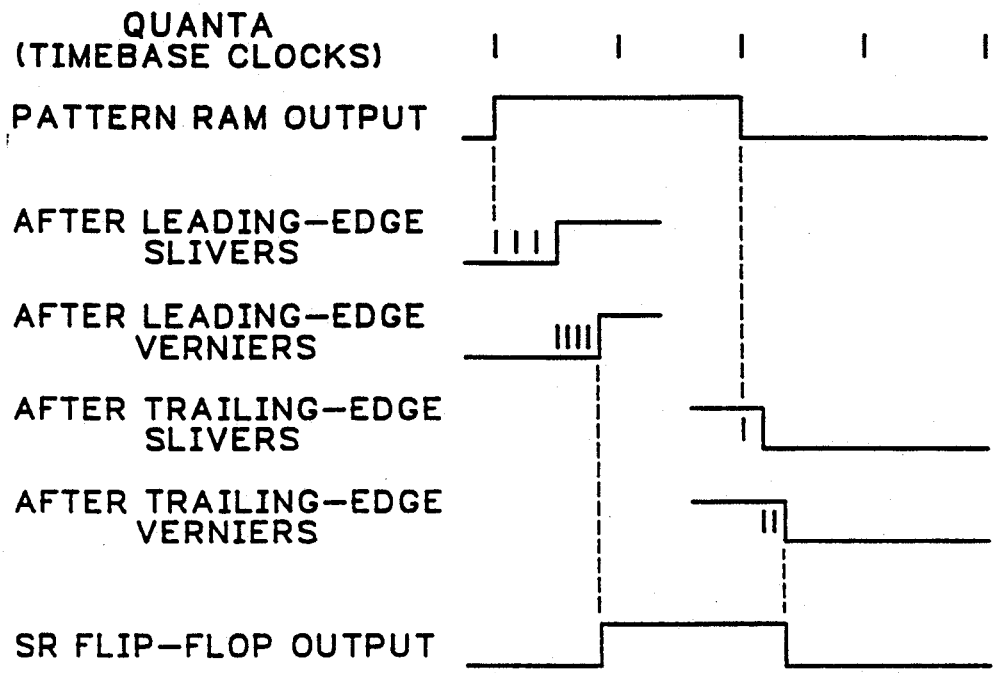
FIG. 9A USE OF SLIVERS AND VERNIERS
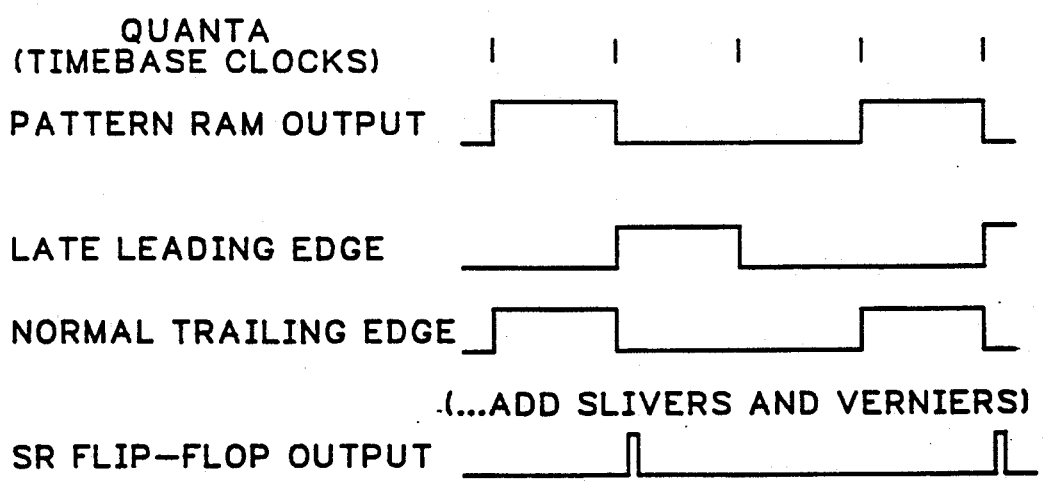
FIG. 9B USE OF LATE LEAD

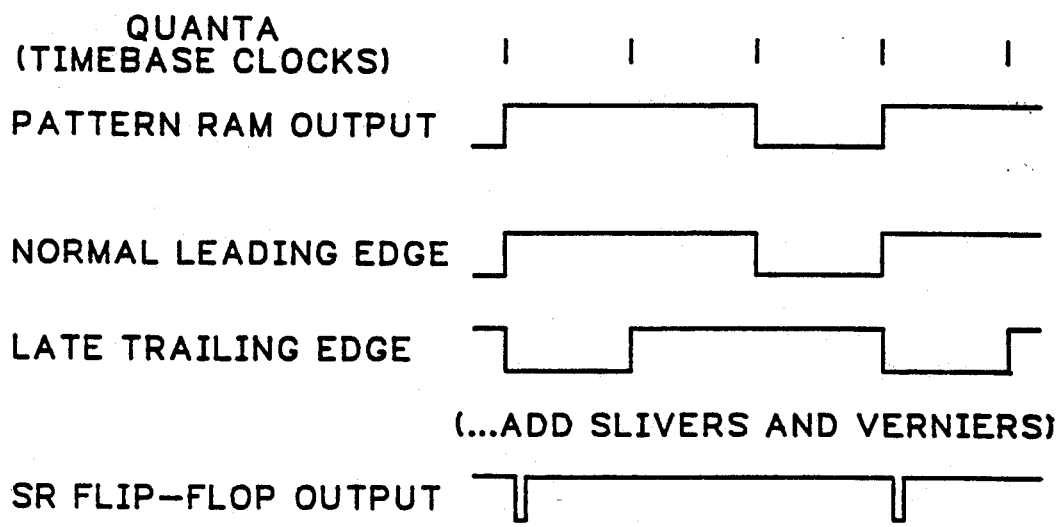
FIG. 9C USE OF LATE TRAIL
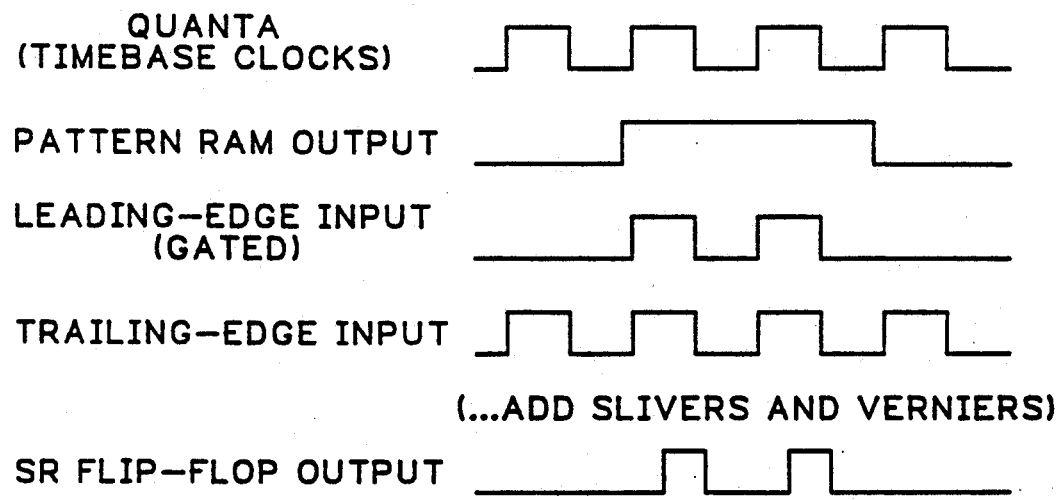
FIG. 9D STRAIGHT-THROUGH MODE

DIGITAL PULSE GENERATOR USING DIGITAL SLIVERS AND ANALOG VERNIER INCREMENTS

This is a division of application Ser. No. 07/606,387 filed Oct. 31, 1990, now U.S. Pat. No. 5,208,598.

BACKGROUND OF THE INVENTION

This invention relates to the field of pulse generation, and more particularly to the field of a digital pulse synthesis architecture permitting accurate edge placement, superior channel-to-channel stability, and accurate trigger output positioning relative to any pulse in a burst of pulses.

Prior art pulse generators primarily rely on analog circuitry for many of their critical timing parameters. For example, a prior art pulse generator whose architecture is described in the August 1990 Hewlett-Packard Journal, uses one-shot multivibrators as delay and width timing generation elements. The critical timing specifications that result from this analog approach produce tolerances that are proportional to the length of the delays or widths involved. Also, each channel's tolerances are independent of each other, and therefore channel-to-channel specifications are additive with respect to their independent tolerances.

According to the present invention, a more completely digital approach to pulse generation produces more controllable tolerances, especially channel-to-channel tolerances.

Many of those who purchase pulse generators today are interested in characterizing high speed digital devices by observing with a sampling oscilloscope the relationship between an applied stimulus from a pulse generator and the response of a device under test. Sampling oscilloscopes have very high bandwidths, but, as a result of how they obtain that high bandwidth, have a delay of from 20 to 70 nanoseconds from the time that they are triggered to when they are actually able to sample their input. This delay is known as the "pretrigger" time, and creates problems for those who want to use sampling oscilloscopes in conjunction with conventional pulse generators since conventional pulse generators do not provide user control of accurate placement of their trigger output signals in time.

What is desired is a pulse generator that permits user control of highly accurate placement in time of the trigger output signal relative to the pulse output, either forward or backward in time.

Prior art pulse generators also are limited in their ability to position trigger pulses accurately with respect to pulses late in a burst of pulses. In testing with a traditional pulse generator and a digital sampling oscilloscope, the oscilloscope must be triggered off the trigger out signal from the pulse generator and the oscilloscope channel delay adjusted to look at the interval of interest. As an example, to look at the roll-over of an eight bit synchronous counter, one wants to generate 255 clock pulses to fill up the counter before the interesting event actually occurs. The event of interest then occurs after 255 pulse periods. If the pulse frequency is 100 MHz, a delay of 2550 nanoseconds occurs before the event of interest. But the typical RMS jitter of a conventional pulse generator at this setting is 0.05% of the programmed interval, in this case 1.275 nanoseconds of jitter emanating from the pulse generator, not including the jitter of the oscilloscope. Obviously, in this environment, the user's ability to detect output timing variations due to other factors is degraded.

What is desired is a pulse generator that can accurately and adjustably position a trigger out signal relative to any pulse that it produces, even pulses near the end of a large burst of pulses.

Prior art pulse generators typically only permit trailing edge placement to be defined by the delay before the leading edge and the width of the pulse. In these pulse generators, when the pulse delay is varied, the width remains constant and the trailing edge moves accordingly.

What is desired is a pulse generator that provides the ability to specify the trailing edge timing directly.

In prior art pulse generators if the period is changed, but the operator desires to have a pulse that is proportionally the same in terms of delay and width, the operator must explicitly calculate and set new values for delay and width. Some prior art pulse generators have a "duty factor mode", which automatically recalculates the pulse width to keep it proportional when the period is changed, but delay values are still fixed.

What is desired is a pulse generator in which both pulse width and phase can be specified as a percentage of the overall period and the pulse generator will then automatically keep the width proportional and its phase constant when the frequency is changed.

While some prior art pulse generators allow their internal oscillators to be synchronized with an external frequency source, their trigger input signals then become asynchronous with respect to the output pulses except to the extent that the external frequency source and the trigger input can be synchronized externally.

What is desired is a means for controlling by the use of an external signal when bursts of pulses synchronized to an external frequency source will begin.

It would also be desirable to have some channels running at half the rate of the others, but synchronized with them. It would further be desirable to be able to disable a channel, but have it maintain a dc voltage output at an operator determined level.

Prior art pulse generators use external measurements and user calibration adjustments to maintain the time accuracy of their pulse outputs.

What is desired is an automatically self-calibrating pulse generator that only requires the operator to connect an output to a calibration input in order to accomplish the calibration.

SUMMARY OF THE INVENTION

Accordingly, it is the object of the present invention to provide a pulse generator with a unique digital architecture that produces more controllable tolerances, especially channel-to-channel tolerances, that can accurately position a trigger out signal relative to any pulse that it produces, that allows the user to specify the trailing edge timing directly, that permits both pulse width and phase to be specified as a percentage of the overall period and the pulse generator then automatically keeps the width proportional and its phase constant when the frequency is varied, that provides a means for controlling, by the use of an external signal, when bursts of pulses synchronized to an external frequency source will begin, that allows some channels to run at half the rate of the others, but synchronized with them, that permits the operator to disable a channel, but have it maintain a dc voltage output at an operator determined level, and that is automatically self-calibrating, only requiring the operator to connect the output to a calibration input to accomplish the calibration.

In a preferred embodiment, the present invention includes a triggerable voltage controlled oscillator (VCO) with two sources of frequency control voltage, an internal DAC and a phase frequency comparison with an external timebase. In a top octave of operation, the output of the triggerable VCO is used to produce output pulses whose edge locations are then adjusted by small digital increments or "slivers" and very small analog increments or "verniers". In lower octaves of operation, the contents of a pattern RAM serve to frequency divide the triggerable VCO output frequency by powers of two. The RAM contents are converted to a serial bit stream that imposes the coarse pulse width and period as an integral number of top octave periods, or quanta. The edge locations are then adjusted with slivers and verniers, as in the top octave. An on-board high quality frequency counter and long time constant A/D converter, as well as a calibration input with a precisely fixed in time threshold detector, permits automatic self-calibration.

The subject matter of the present invention is particularly pointed out and distinctly claimed in the concluding portion of this specification. However, both the organization and method of operation, together with further advantages and objects thereof, may best be understood by reference to the following detailed description and accompanying drawings.

BRIEF DESCRIPTION OF THE DRAWINGS

FIG. 9A is an illustration (not to scale) of how slivers and verniers are added to quanta to produce any desired edge placement, FIG. 9B is an illustration of the use of a late lead signal, FIG. 9C is an illustration of the use of a late trail signal, and FIG. 9D is an illustration of the straightthrough or top octave mode.

DETAILED DESCRIPTION

The pulse generator of the present invention has six modes of operation: auto with internal timebase, burst with internal timebase, auto-burst with internal timebase, auto phase-locked to external timebase, burst phase-locked to external timebase, and auto-burst phase-locked to external timebase. In either of the auto modes, a continuous stream of pulses is generated that has the following user defined parameters: high voltage level, low voltage level, timing relationship to a trigger pulse, width, period, and phase. In burst mode, a single burst of such pulses is generated in response to a triggering event, the burst containing a user specified number of pulses. In the auto-burst mode, bursts are continually generated after intervening intervals of inactivity. An external signal must be stable and continuous to be a suitable phase-locked reference. The phase-locked pulse stream output can be at $2^N$ multiples or sub-multiples of the reference input.

Figure 1:
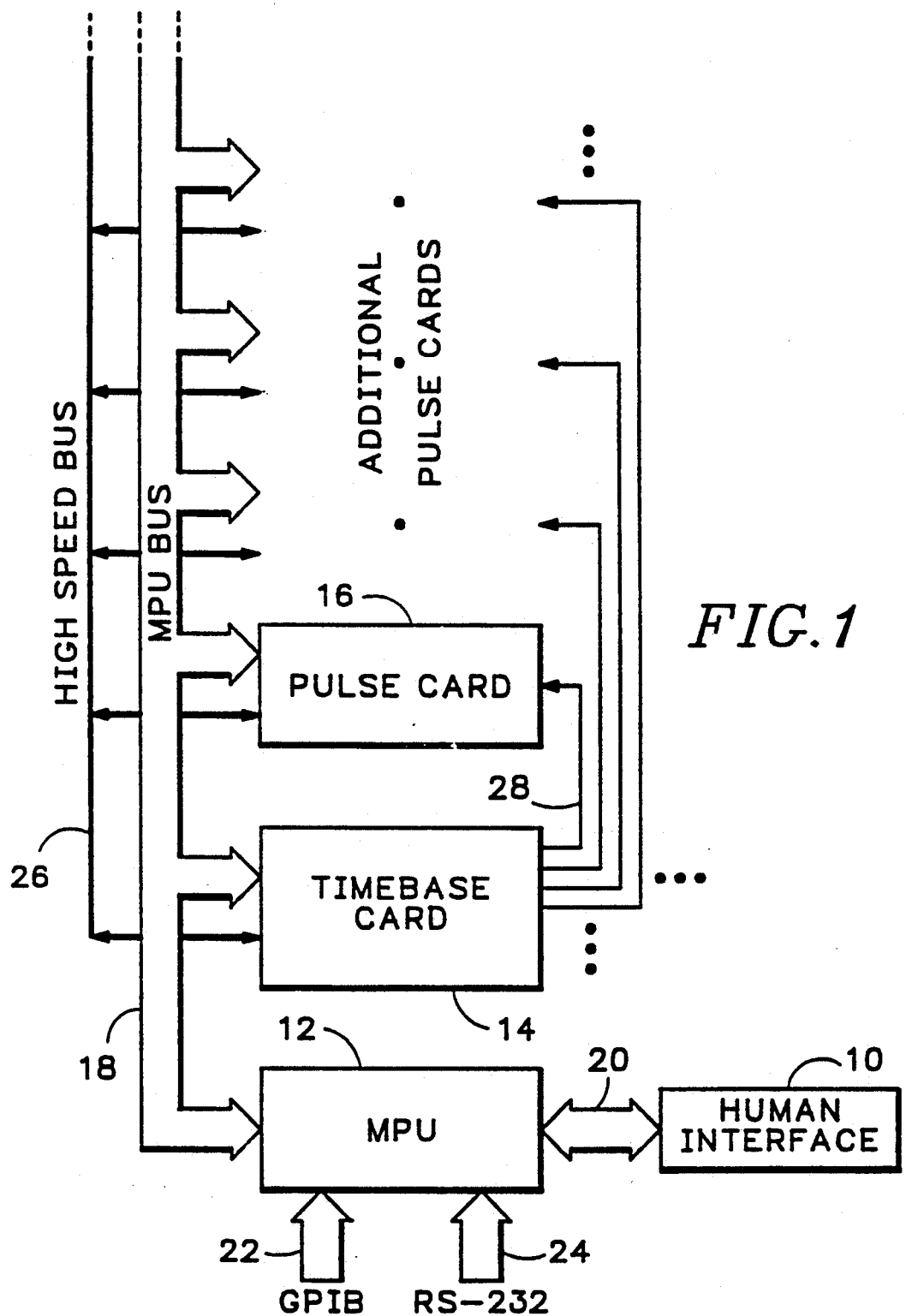
FIG. 1 is a module level diagram of the digital pulse generator according to the present invention.

Referring now to FIG. 1, a microprocessor unit MPU 12 communicates with a timebase card 14 and pulse cards 16 over an MPU bus 18. In the first version of this instrument to be built, the MPU bus is a VXI compatible bus. The MPU also communicates with a human interface 10 over a separate human interface bus 20. Facilities are also provided for communicating with remote operators or other instruments via GPIB 22 and RS-232 24 ports. A high speed bus 26 permits rapid communication between the pulse cards 16 and the timebase card 14. Shielded twisted pairs 28 carry a high speed clock signal (/TVCO clocks) from the timebase card 14 to each of the pulse cards 16.

The timebase card 14 has five connectors on its front panel: a trigger input, a trigger output, a phase-lock input, a frame-sync input, and a skew calibration input. The trigger input is used to tell a burst when to begin in burst mode. The trigger output tells another instrument, such as an oscilloscope, when a burst is to occur. The advanced capabilities of this trigger output will be further described below. The phase-lock input is for connecting to the external frequency reference. The frame-sync input is used in the burst phased-locked to an external timebase mode to "arm" the next burst. The exact timing of the burst is determined by the phase-lock input, but it will occur on the next clock edge after the frame-sync input occurs. The skew calibration input is used as part of the automatic calibration technique, as will be explained in detail below.

Each pulse card 16 contains two pulse generation channels. Each channel has three connectors associated with it, an output, an inverted output, and a transducer input. The transduce input allows the operator to bypass the pulse generator's internal circuitry and use only the pulse generator's output amplifier to produce a high quality square pulse with controllable high and low voltage levels from whatever signal is already available.

As will be further explained below, the timebase card 14 and the pulse cards 16 are configured with particular instructions by the MPU 12 over the MPU bus 18 in advance of actual pulse generation. Once the timebase card 14 and pulse cards 16 have been configured they operate as independent state machines to produce pulses or bursts of pulses according to the instructions they received in advance, communicating as necessary with each other over the high speed bus 26. A simple handshake procedure between the instrument cards allows them to re-arm and continue with additional bursts without any help from the MPU 12.

While they are running, the pulse cards 16 each hold down the high speed bus 26 line /running, which is a shared open-collector signal line. As individual cards finish their bursts, each one lets go of the /running line, so that when they are all done /running goes high. This informs the timebase card that all of the pulse cards are through running. If there is to be another burst, the timebase card asserts /initing low and on the next stateclk each of the pulse cards also asserts /initing as they begin their respective initialization routines. As they complete their initialization process, they each de-assert /initing, until they all have let go of that line and it changes state back to high, informing the timebase card that they are all ready for the next burst to begin.

Figure 2A:
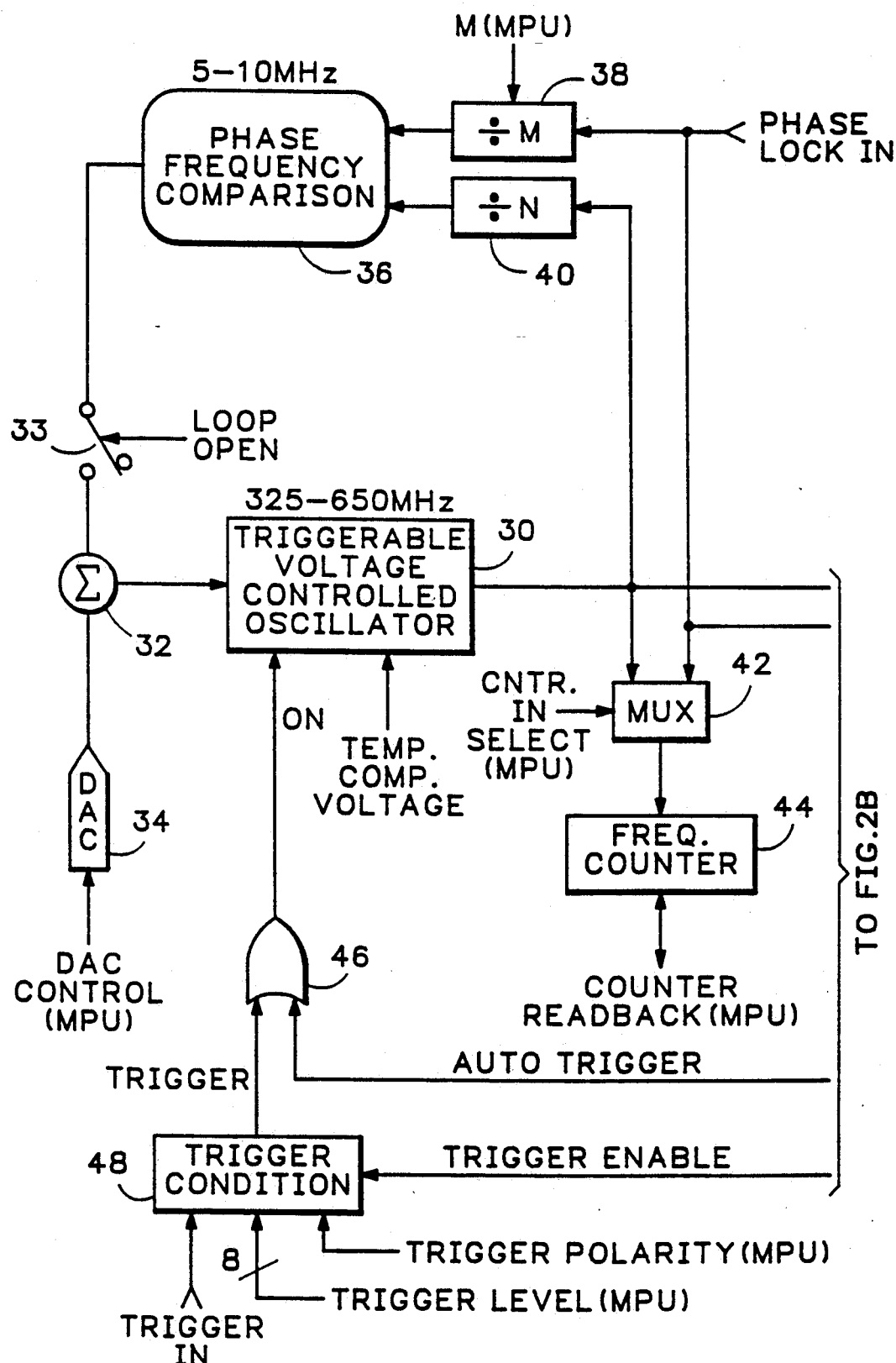
FIGS. 2A and 2B are a block diagram of the timebase card of the digital pulse generator according to the present invention.
Figure 2B:
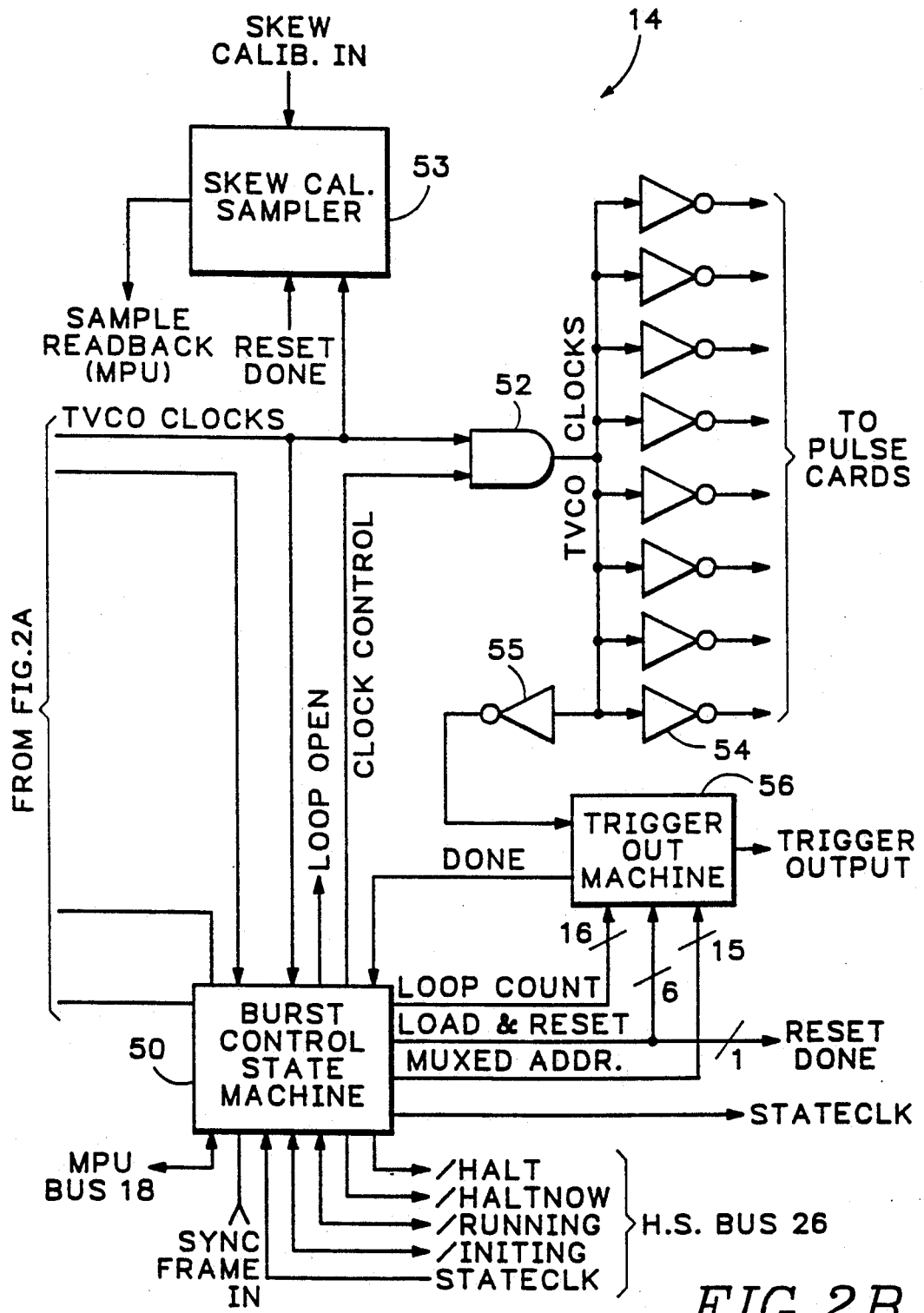

Referring now to FIGS. 2A and 2B, a triggerable voltage controlled oscillator (VCO) 30 with a range of one octave from 325 MHz to 650 MHz is controlled in frequency by a VCO control voltage derived from either one or two sources. One of these sources is the digital-to-analog converter (DAC) 34 under the control of the MPU 12. When the digital pulse generator is in one of modes in which it is synchronized to an external timebase, switch 33 is closed by the de-assertion of the loop open signal from the burst control state machine 50 and another source of triggerable VCO control voltage is added to the voltage from DAC 34 by summing circuit 32. The phase frequency comparison circuit 36 senses the relationship between the phase-lock input divided by M in the divide-by-M circuit 38 and the present triggerable VCO 30 output after being divided down in frequency by the divide-by-N circuit 40.

Because the phase frequency comparison circuitry 36 operates in the 5-10 MHz region and the output of the triggerable VCO is from 325 MHz to 650 MHz, in practice N can be left a constant with a value of 64. M is varied by the MPU 12 to create different $2 \char`\^ N$ multiples and sub-multiples of the frequency of the phase lock input signal, which can be anywhere from 6-600 MHz. When the operator has specified the desired relationship between internal timebase and the phase lock input signal, the MPU can effectuate that relationship by setting up the divide-by-M circuit 38 appropriately.

The MPU 12 can measure the frequency output of the triggerable VCO 30 and the phase lock input signal using counter readback signals from an on-board frequency counter 44 and appropriate select signals to multiplexer 42. The frequency counter 44 is a four and one-half, auto-ranging, crystal-controlled frequency counter.

In phase-locked modes of operation, the MPU 12 uses readback from the frequency counter 44 to measure the incoming phase lock input signal frequency. It then sets the DAC 34 output voltage to a setting that corresponds to that frequency. The phase frequency comparison circuitry 36 then produces a correction voltage representing any difference in phase between the TVCO output divided-by-N and the phase lock input signal divided-by-M, thereby keeping the TVCO clocks synchronized with the phase lock input signal.

A triggerable VCO is described in an article, hereby incorporated by reference, entitled "Universal Counter Resolves Picoseconds in Time Interval Measurements" by Chu, Allen, and Foster from the August 1978 edition of the Hewlett-Packard Journal. At power-up, the MPU 12 applies a series of voltages to the triggerable VCO 30 using the DAC 34. During the application of each voltage the MPU 12 monitors the frequency of the triggerable VCO 30 output using the frequency counter 44 and stores the results of this testing in a table that then allows the MPU 12 to produce any desired frequency within the range of the triggerable VCO 30 by selecting an appropriate voltage from this table.

The triggerable VCO 30 is activated by the ON signal from OR gate 46. ON is true as the result of either a trigger signal from trigger condition circuit 48 or an auto trigger signal from burst control state machine 50. The trigger condition circuitry 48 receives a trigger enable signal from the burst control state machine 50 and trigger polarity and trigger level information from the MPU 12, as well as the actual trigger input signal from the front panel of the timebase card 14.

The MPU 12 informs the burst control state machine 50 of the mode in which it is to operate by loading local registers that are an extension of control registers 72 (FIG. 3B) with three bits of information: one signifying whether or not the mode is auto, another signifying whether or not the mode is burst, and the third signifying whether or not the mode is phase-locked to an external timebase. Slave burst control state machines 60 (FIG. 3A) on the pulse cards 16 only receive information indicating whether they are to be in burst mode or not. The burst control state machine 50 and slave burst control state machines 60 communicate with each other via the high speed bus signals /halt, /haltnow, stateclk, /running and /initing ("not initializing"), as described above.

The burst control state machine 50 and slave burst control state machine 60 receive programming information at power-up to tell them how to operate in each mode from ROM chips (not shown) on their respective boards. The state machines are implemented in Xilinx TM XC3030PC84-70 chips from Xilinx Inc. of San Jose, Calif., that are capable of assuming different logic configurations based on the programming information that they receive from the ROMs.

Because the phase frequency comparison circuitry 36 does not respond rapidly to changes on its input, many microseconds of operation are required to stabilize the phase lock loop. Consequently, in all of the phased-locked to an external timebase modes of operation the triggerable VCO is left running continuously and the TVCO clocks are gated via AND gate 52 by the clock control signal from the burst control state machine 50.

The burst control state machine 50 receives the frame sync and phase lock inputs from the timebase card 14 front panel and TVCO clocks from the output of the triggerable VCO. When a frame sync input is received in the auto-burst phase-locked to external timebase mode, the clock control signal to AND gate 52 is made high to allow the TVCO clocks to pass through to inverting buffer amplifiers 54 which forward them to the pulse cards as /TVCO clocks. Since the timing of the opening of AND gate 52 is critical to starting the distribution of the first clock at the correct phase, the burst control state machine 50 uses first the phase lock input and then the TVCO clocks to synchronize the frame sync signal so that it becomes a clock control signal with the correct timing.

In contrast, in auto-burst with internal time-base mode, the clock control signal is maintained high so that AND gate 52 is always open and the triggerable VCO is activated for additional bursts via the auto trigger signal to OR gate 46.

The trigger out machine 56 also receives the /TVCO clocks from AND gate 52 via 55 and responds to them by producing the trigger out signal at the proper relative timing according to the information that it has been pre-programmed with by the MPU. The trigger out machine 56, in a preferred embodiment, is very nearly identical to one of the pulse card 16 channels to be described in detail below in connection with FIG. 3, except that it does not have a pattern RAM 62 and it receives one additional signal burst, that causes it to only produce one trigger per burst when active and one trigger for every pulse when inactive. The pattern RAM 62 is not needed, since the trigger out machine 56 only produces a single pulse with the TVCO clock period rather than a pulse requiring a pattern for its definition.

The skew calibration sampler 53 receives TVCO clocks from the triggerable VCO 30 and the skew calibration input from the front panel. It counts 128 TVCO clocks and then samples the skew calibration input to ascertain its state at that instant. It is reset during initialization by the signal reset done, one of the load and reset signals produced by the burst control state machine 50. The result of the sampling process is read back by the MPU 12 during calibration, as will be further explained below.

Figure 3A:
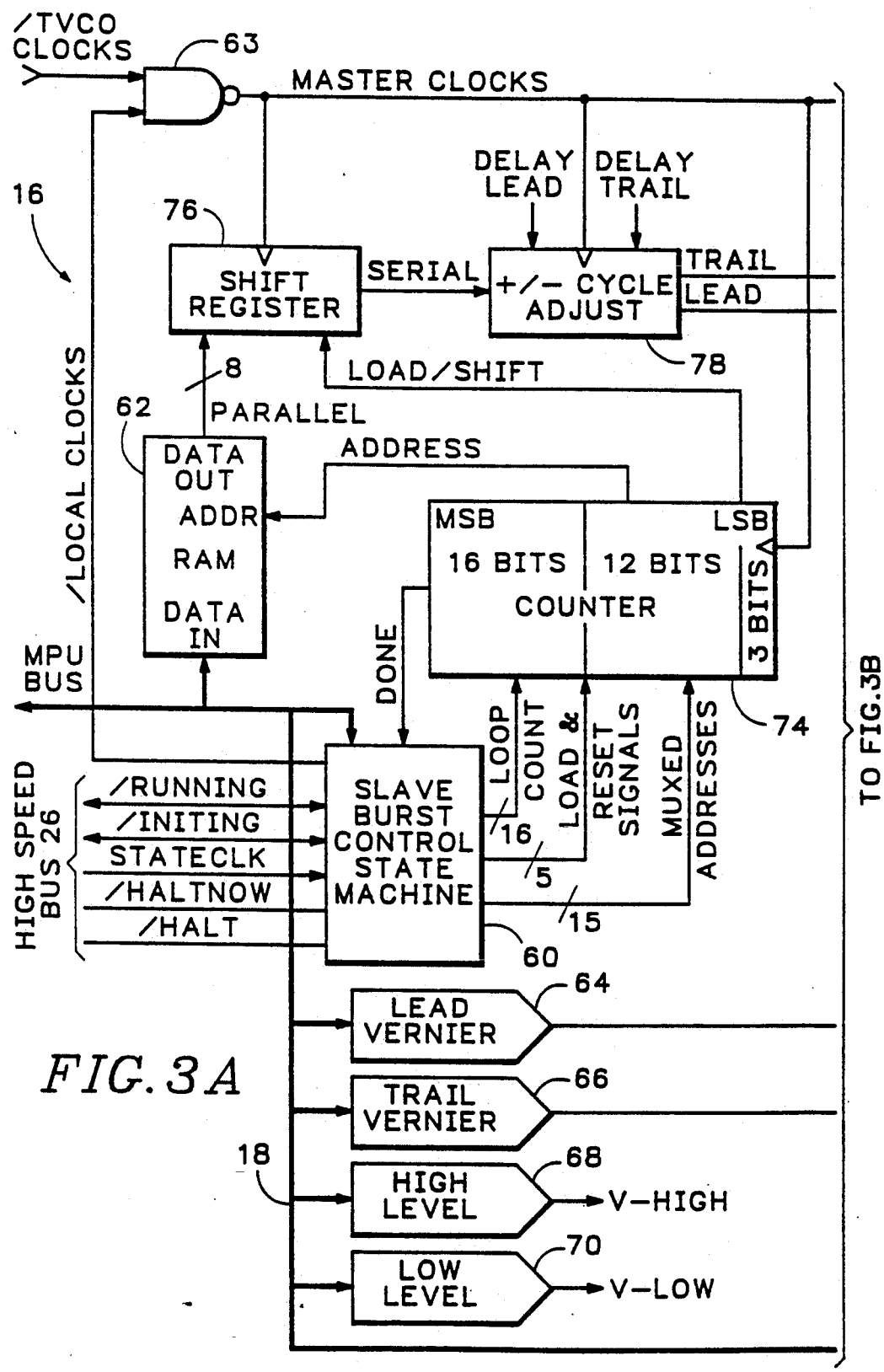
FIGS. 3A and 3B are a block diagram of the pulse cards of the digital pulse generator according to the present invention.
Figure 3B:
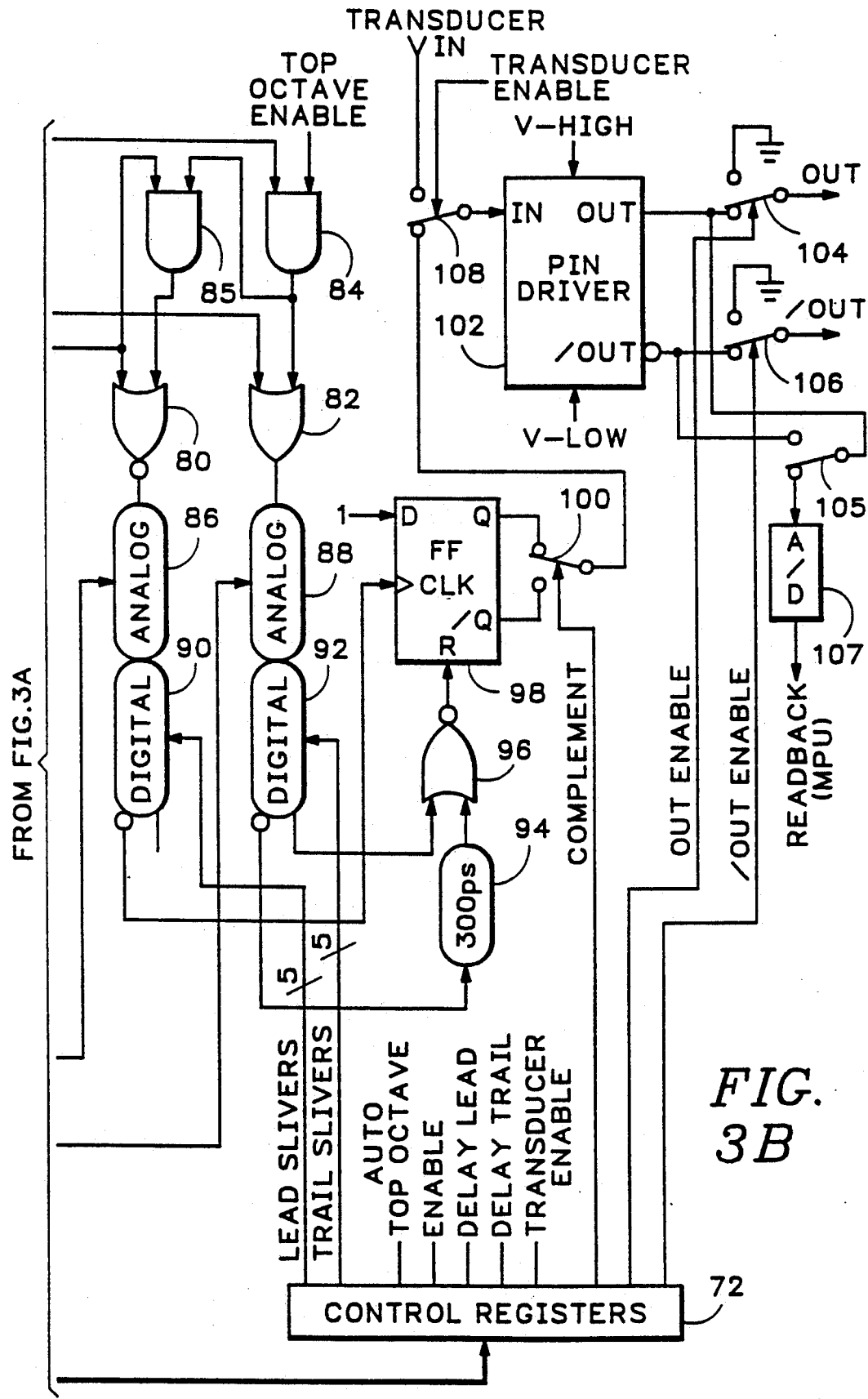
Figure 4:
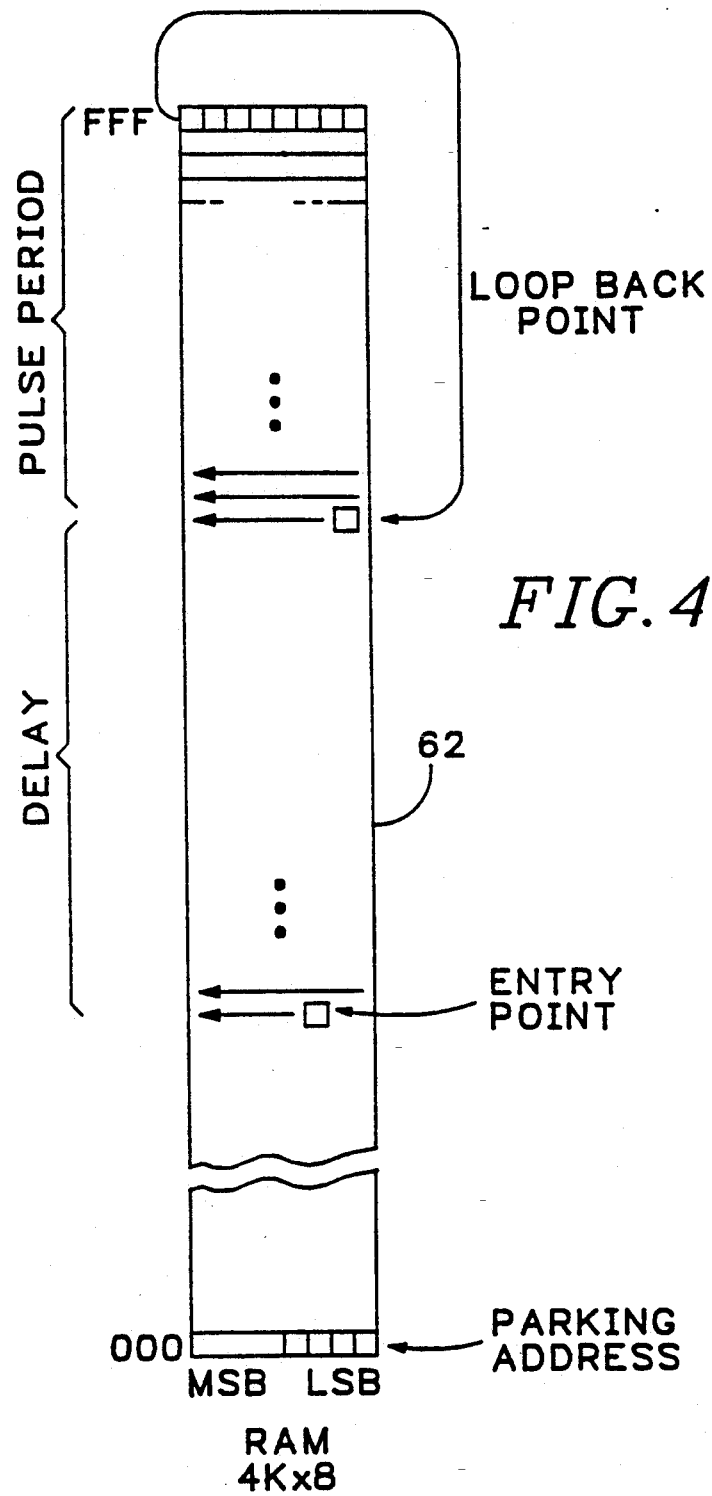
FIG. 4 is a explanatory diagram of how the random access memory is used to determine delay, width, and period according to the present invention.

Referring momentarily to FIG. 3A, the block diagram of the pulse cards 16, the MPU 12 supplies pattern information to pattern RAM 62 over MPU bus 18. Referring now to FIG. 4, pattern RAM 62 is a 4k by 8-bit random access memory. The pattern placed in the pattern RAM 62 is intended to initially be addressed at the Entry Point. The contents of the pattern RAM 62 between the Entry Point and the Loop Back Point are all zeroes, except for an exception discussed below, and act as a delay before the first pulse is to occur. As will be further explained below, this pattern RAM 62 will be clocked out, eight bits at a time at one eighth of the master clock frequency, and converted to a serial bit stream at the full master clock frequency. This bit stream, in turn, controls the production of a pulse or pulses by the rest of the circuitry shown in FIG. 3.

To enter the pattern RAM 62 at an Entry Point that is not the least significant bit at a particular address, the shift register 46 is pre-clocked by the slave burst control state machine 60 /local clocks which are combined with /TVCO clocks by AND gate 63. When the timebase card is not providing /TVCO clocks, /TVCO is held high to allow the /local clocks to pass through AND gate 63. Conversely, when the slave burst control state machine 60 has finished initializing, it holds /local clocks high so that /TVCO clocks can pass. Thus, master clocks is the ORed sum of /local clocks and /TVCO clocks, thereby permitting the slave burst control state machines 60 to pre-clock the shift register 76 during initialization and the triggerable VCO 30 to perform that function after initialization and a trigger. Loop Back Points are always on the least significant bit of their address, thus avoiding any need for pre-clocking during loopback. If the whole pattern is shorter than eight bits, it is repeated to fill eight bits, so that loop back can be to a least significant bit. This works well because of a restriction that all patterns must be integral powers of two.

The region between the Loop Back Point and the end of memory is, in the usual case, divided into two regions by the width of the pulse. The data in the first of these regions represents the time that the pulse is high, that is its width, and it is filled with ones. The data in the second of these regions represents the time that the pulse is low, and it is filled with all zeros. The whole of these two regions represents the period of the pulse, while the first portion defines the pulse width (high-going) and the remainder defines the rest of the period (low-going). Phase delay, an interval with respect to a reference time that the beginning of the pulse width is delayed, is included in the delay between the Entry Point and the Loop Back Point. To minimize jitter and make looping back delay free, the pattern RAM 62 is only loaded with patterns that are an even power of two in their period. Thus, the pattern in the pattern RAM 62 in effect performs a frequency division on the master clock frequency.

The Loop Back Point is repeatedly re-entered to produce a sequence of identical pulses. Referring to FIG 3A, the number of re-entries is determined by the contents of the most significant bits of the output of counter circuitry 74, loop count, and corresponds to the number of pulses in a burst for pulses whose period is longer than eight bits. For shorter pulses that are only one, two or four bits long, multiple pulses occur with each trip through the loop, and any extra pulses that are required to satisfy the operator's specification of burst length are placed just before the Loop Back Point in the delay region that is otherwise filled with all zeros. When all of the pulses specified have been produced the counter circuitry, as will be explained further below, produces the Parking Address.

Referring again to FIG. 3, the MPU 12 (FIG. 1) also uses the MPU bus 18 to supply appropriate settings to lead vernier DAC 64, trail vernier DAC 66, high level DAC 68, low level DAC 70, and control registers 72. The control registers then contain a wide range of information, including five bits each of lead and trail sliver information, a bit indicating whether the mode is auto or not, a bit indicating whether or not the top octave is being used (enabled), two bits indicating whether lead or trail signals are to be delayed, a bit to enable the transducer if it is to be used, and two bits that enable the pulse output and its complement.

The MPU 12 also uses the MPU bus 18 to supply loop address and loop count information to slave burst control state machine 60. The slave burst control state machine 60 also communicates between bursts with the other instrument cards in the system over the high speed bus 26 signal lines /running, /initing (not initializing), stateclk, /haltnow, and /halt. Stateclk is a 3 MHz clock that synchronizes the activities of the burst control state machine 50 and the slave state control state machines 60 as they perform initialization and communicate with each other.

The /halt and /haltnow lines are controlled by the MPU 12 via the burst control state machine 50. The MPU 12 directs the burst control state machine 50 to assert /halt via a message on the MPU bus 18. The burst control state machine 50 then asserts /halt by making it low, telling the slave burst control state machines 60 on the pulse cards 16 to halt in an orderly fashion after the completion of the next burst.

If, however, the instrument is in one of the two auto modes, internal timebase or phase locked to the external timebase, there is not going to be an end of a burst and an opportunity for an orderly shut-down. Under these circumstances, the MPU 12 first asserts the /halt line through the burst control state machine 50 on the timebase card 14 and then pulses the /haltnow line to its asserted condition temporarily. The timebase card 14 and pulse cards 16 respond to this by interrupting their activities immediately. When stopped by either means, the pulse cards de-assert /running letting it go high. The /halt line remains asserted by burst control state machine during the time that the MPU 12 is programming the various cards over the MPU bus 18.

The above conceptual description, given in connection with FIG. 3, of how the RAM 62 (FIG. 4) works has been somewhat oversimplified. While that discussion conveyed the concept accurately, the implementation is actually more complicated in order to be able to achieve the high speed and instantaneous recovery from one pulse to the next that are required to make the concept work.

Figure 5:
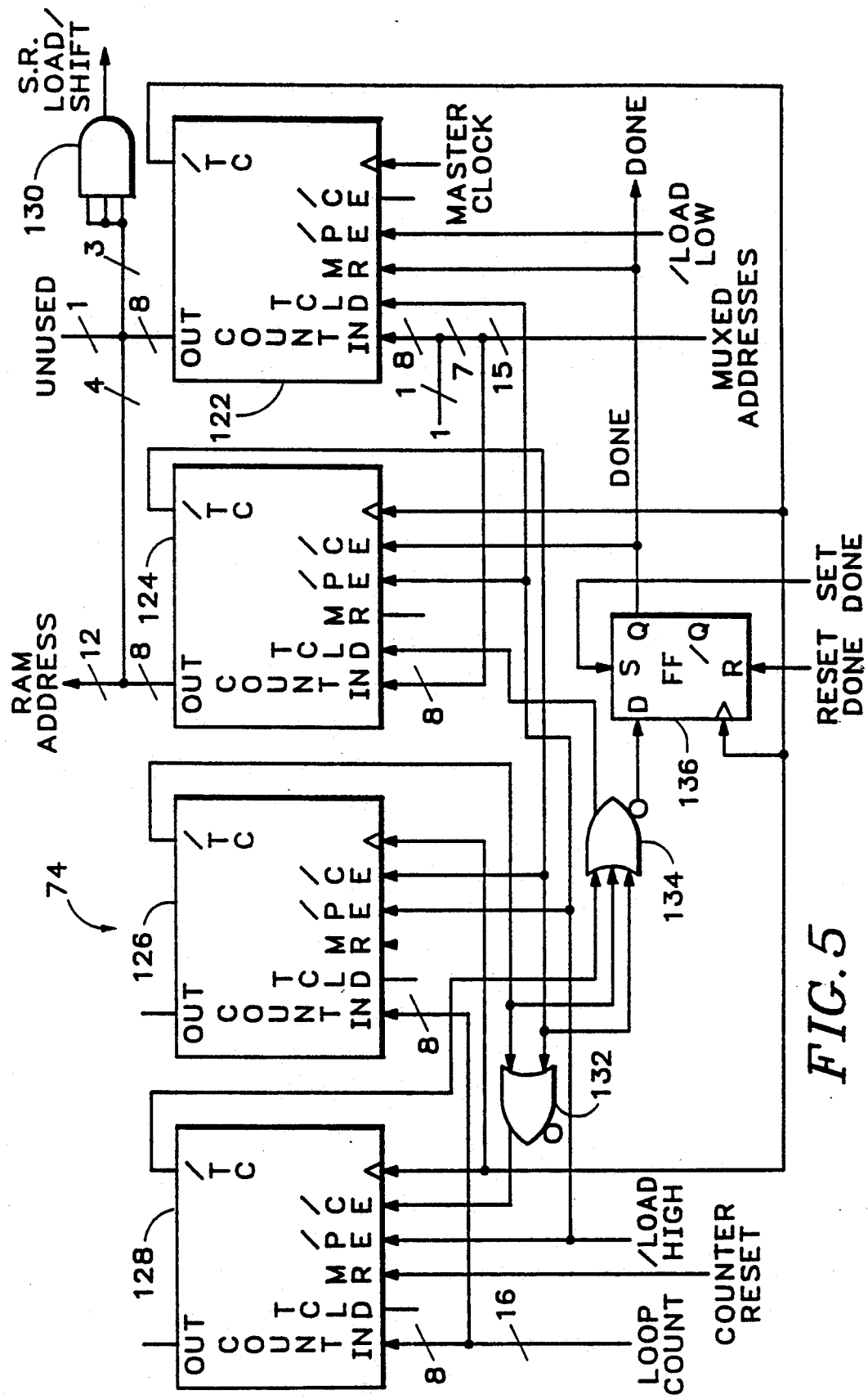
FIG. 5 is a schematic diagram of counter circuitry, FIG a explanatory diagram of how precise delays are created according to the present invention.

Referring now to FIGS. 3 and 5, the slave burst control state machine 60 controls the address lines to the counter circuitry 74 and also controls five other signals that go to the counter circuitry 74: /load low, /load high, set done, reset done, and counter reset. /Load low goes to the parallel load enable control input of counter 122, while /load high goes to the parallel load control input of counters 124, 126, and 128, and to the TCLD control input of counter 122. As explained in the Motorola ECLinPS Device Data book (Q1/89), hereby incorporated by reference, when the TCLD input to these E016 8-Bit Synchronous Binary Counters is high, the internal /TC feedback causes the counter to automatically reload on the rising edge at the end of /TC being active. Thus, when /load high is inactive high, which is usually the case, counter 122 is in its reload on terminal count mode.

The counter reset signal goes to the MR control input of counter 128. It is used in the auto modes to keep counter 128 from ever producing a terminal count, thereby allowing auto mode pulses to continue indefinitely. The set done signal causes flip-flop 136, the "done" flip-flop, to set. It is used to stop the counter circuitry 74 when it is in the auto modes of operation. Reset done resets the same flip-flop. It is used to reset flip-flop 136 at the beginning of each initialization sequence. When the done flip-flop 136 is set it disables counter 124 via the /CE (not count enable) control input. It also resets counter 122 via the MR (master reset) control input. Holding counter 122 reset keeps all of the counter circuitry from running, since the other counters 124, 126, and 128 are all clocked by the rising edge at the end of counter 122 terminal counts /TC. The done signal is also monitored by the slave burst control state machine 60 so that it can tell when the counter 74 is done.

The most significant bit of the least significant byte counter 122 is always loaded with a "1" and ignored on the output, thereby effectively converting counter 122 to a 7-bit counter and the overall counter circuitry 74 to a 31-bit counter. All of the loaded data is the two's complement of the desired count, so that the desired count is reached on the first clock after the terminal count (FF+1=00).

| SLAVE BURST CONTROL STATE MACHINE | | | | | |
|---|---|---|---|---|---|
| State | Reset Done | /Load Low | /Load High | /Local Clock | Address to Cntr |
| 0 | 0 | 1 | 1 | 1 | 0000 |
| 1 | 1 | 0 | X | 1 | FFFF |
| 2 | 1 | 0 | X | 0 | FFFF |
| 3 | 1 | 1 | 0 | 1 | Initial |
| 4 | 1 | 1 | 0 | 0 | Initial |
| 5 | 1 | 0 | 1 | 1 | Initial |
| 6 | 1 | 0 | 1 | 0 | Initial |
| 7 | 1 | 1 | 1 | 1 | LoopBack |
| 8 | 1 | 1 | 1 | 0 | LoopBack |
| 9 | 1 | 1 | 1 | 1 | LoopBack |
| 10 | 1 | 1 | 1 | 0 | LoopBack |
| 11 | 1 | 1 | 1 | 1 | LoopBack |
| 12 | 1 | 1 | 1 | 0 | LoopBack |
| 13 | 1 | 1 | 1 | 1 | LoopBack |
| 14 | 1 | 1 | 1 | 0 | LoopBack |
| 15 | 1 | 1 | 1 | 1 | LoopBack |
| 16 | 1 | 1 | 1 | 0 | LoopBack |
| 17 | 1 | 1 | 1 | 1 | LoopBack |
| 18 | 1 | 1 | 1 | 0 | LoopBack |
| 19 | 1 | 1 | 1 | 1 | LoopBack |
| 20 | 1 | 1 | 1 | 0 | LoopBack |
| 21 | 1 | 1 | 1 | 1 | LoopBack |
| 22 | 1 | 1 | 1 | 0 | LoopBack |
| 23 | 1 | 1 | 1 | 1 | LoopBack |
| ... | | | | | |
| 30 | 1 | 1 | 1 | 1 | LoopBack |
| 31 | 1 | 1 | 1 | 1 | LoopBack |

Referring now to the table Slave Burst Control State Machine, the slave burst control state machine 60, having received pre-calculated data from the MPU 12, over the MPU bus 18, is in state 0, halted, waiting for /halt to go high on the high speed bus 26. When /halt goes high, the state machine enters state 1 and does the following: asserts /load low and /load high active low, asserts reset done active high, and places all ones on the input to the counter circuitry 74.

State 2 generates a /local clock that passes through AND gate 63 and becomes a master clock to cause the loading of counter 122 with all ones. The /local clock passes through AND gate 63 because the timebase card 14 leaves /TVCO clock high during the initialization process. Note that the upper three bytes of counter 124, 126, and 128 are not loaded, since they are only clocked by the rising edge at the end of the terminal count /TC from counter 122, not by master clocks.

With all ones in the low byte counter 122, the terminal count signal /TC from that counter is asserted low. In state 3 the /load low signal is de-asserted and the Initial address is put on the input to the counters. This initial address is the Entry Point of FIG. 4 minus eight bits. In state 4 another /local clock is generated, causing counter 122 to roll over to all zeros, sending /TC inactive and thereby clocking the initial address into the upper three byte counters 124, 126, and 128.

Next, in state 5, the /load high signal is deasserted and the /load low signal is asserted. The next /local clock, generated in state 6, then clocks the lower byte of the initial address into counter 122. The Initial address is now loaded into all bytes of the counter circuitry 74.

In state 7, the slave burst control state machine 60 de-asserts /load low and begins presenting the Loop Back address to the counter circuitry 74. The next 16 states produce 8 /local clocks, which advance the Entry Point to be the next output of the shift register 76. The data in these locations is all zeros, so the shift register is flushed out in the process. At the end of this series of clocks, the slave burst control state machine 60 leaves /local clock high, enabling AND gate 63 for the appearance of TVCO clocks. The counter circuitry 74 and shift register 76 are now fully ready, except for the active reset done signal that is holding the done flip-flop 136 reset.

Nothing further happens until the end of state 31, at which time the slave burst control state machine 60 rolls over to state 0 and reset done is de-asserted and goes low, enabling counter circuitry 74. The high speed bus 26 signal /initing is also de-asserted at this time by releasing it from being held low.

After the initialization interval is over and a trigger or frame sync occurs, the triggerable VCO becomes active and a stream of master clocks derived from the /TVCO clocks begins to appear at the clock input of the least significant byte counter 122. At the next byte boundary in RAM 62, the three lines representing the least significant bits of the output of counter 122 are again all high, satisfying AND gate 130 so that it goes high for one clock period causing the shift register 76 to load the next byte out of the RAM.

Within 128 clocks, minus any pre-counting done to shift the Entry Point bit to the output of the shift register 76, the least significant byte counter 122 reaches its terminal count. Because /load high has been inactive high since the loading activity ended, the TCLD input to counter 122 is high.

When the terminal count causes counter 122 to reload, the value on the input is the lower 7 bits of the Loop Back Point address. The trailing edge of /TC returning from active low to inactive high clocks counters 124, 126, and 128, and flip-flop 136. As will become more clear later in this discussion, at this time only counter 124 is enabled by a low on its /CE input. This is because flip-flop 136 had been reset during the initialization process.

The clocking effect of /TC from counter 122 will not cause either counter 126 or counter 128 to count or flip-flop 136 to set because the conditions necessary to satisfy OR gates 132 and 134, which are acting as AND gates with respect to active-low logic, have nor occurred yet. OR gate 132 will only produce a low output to enable counting via /CE after the terminal count outputs, /TC, of counters 124 and 126 have both become active low. Similarly, OR gate 134 will only produce a high output on its complement output to place a high on the D input of flip-flop 136 when the terminal count outputs, /TC, of all three counters 124, 126, and 128 are low. Thus, the clock to flip-flop 136 leaves its output low, so that counter 124 will remain enabled by the low on its /CE input and counter 122 will not be reset by a high on its MR (master reset) input.

Because counter 122 was reloaded with the lower bits of the Loop Back address, it is now starting to count from some number (on a byte boundary) other than all zeros, which is the value it would have had if it had merely rolled over and started counting from zero. The consequence of this fact is that some address space in RAM 62 has been skipped over. The overall counter circuitry 74 acts as a "hop counter", moving along through the RAM 62 some number of bytes, N, from 1 to 16 and then "hopping" over some number of bytes, M, where M=16−N. The least significant three bits of counter 122 count bit locations within the bytes addressed by the rest of counter 122 and all of counter 124. The four more significant bits of counter 122 that are counting bytes are the value that determines N and M.

Repeated /TC lows from counter 122 every time that it reaches its (shortened) terminal count, eventually cause counter 124 to reach its terminal count, indicating that the end of the pattern memory has been reached. At this time AND gate 130 produces a final high output (for this trip through memory) loading the contents of the last byte in the RAM 62 into the shift register 76.

The terminal count, /TC active low, of counter 124 enables counter 126 so that the rising edge at the end of the next terminal count of counter 122 successfully clocks counter 126. That same terminal count of counter 122 also increments counter 124 causing its terminal count to go away as it is loaded with its portion of the Loop Back address to immediately begin counting from the Loop Back address. Note that the TCLD input of counter 124 is still high causing a load operation rather than a rolling over, since the absence of a terminal count from counters 126 and 128 means that the output of OR gate 134 is high.

When enough trips through the loop have occurred to bring counter 126 to its terminal count, both of the inputs to OR gate 132 become low, since the terminal count from counter 124 still is present. When both inputs to OR gate 132 are low, its output is low and counter 128 is enabled, so that the next terminal count of counter 122 causes counter 128 to increment. The rising edge at the end of that terminal count also increments counters 124 and 126 so that their terminal counts go away. Counter 128 is not enabled again until both of the counters 122 and 124 again produce a terminal count at the same time. The rising edge at the end of the next terminal count of counter 122 then increments counter 128 again.

When counter 128 fills up and produces its terminal count, counters 124 and 126 are also producing their terminal counts and all of the inputs to OR gate 134 (functioning as a low logic AND gate) become low causing a low output from OR gate 134 and a high output from its complement output. The low on the TCLD input of counter 124 internally changes the significance of the rising edge at the end of its terminal count, so that it will now roll over on the next rising clock input from the end of the terminal count of counter 122. The same terminal count from counter 122 also causes counters 126 and 128 to roll over, since their TCLD inputs are pulled low internally by pull-downs. The high on the D input of flip-flop 136 means that that same terminal count from counter 122 also causes flip-flop 136 to set, in turn causing a master reset of counter 122. Thus, all of the counters are now at zero and the address to the RAM 62 is 000, the Parking Address. And, since counter 122 is held reset by the high from flip-flop 136 and all of the other counters 124, 126 and 128 are clocked by the terminal count from counter 122, the counter circuitry 74 is effectively locked up until another initialization process asserts reset done high.

The slave burst control state machine 60 monitors the done signal from the counter circuitry 74 and when done goes active the slave burst control state machine 60 notifies the burst control state machine 50 on the timebase card 14 by de-asserting /running over the high speed bus 26.

While the use of this "hop counter" lowers RAM 62 utilization, it also provides some very important benefits. In particular, it permits the setup and hold times of all of the parts to be satisfied at very high speeds of operation and it permits a delay free transition from the first time through the RAM 62 based on an initial Entry Point address loading and subsequent times based on the Loop Back Point address loading. All of this is made possible by the elimination of logic to control the operation of the lower two bytes of the counter circuitry, counters 122 and 124.

Because the "hop counter" skips over some of the space in RAM 62, the location used as the Entry Point (FIG. 4) must be adjusted appropriately. The software performing the programming of the hardware "knows" the value that will be loaded into counter 122 as the Loop Back address. If N is the desired count in the four more significant bits of counter 122, then the value to be loaded into them is M, where M=16−N (two's complement). The program has some delay value, corresponding to the operator selected delay as modified by skew calibration and channel delay calibration constants, that it wants to effectuate.

The desired delay is divided by the timebase period to determine how many zeros back from the beginning of active data the Entry Point should be. "Active data", as it is being used here, refers to either the Loop Back Point or, in the case of odd pulses associated with single byte loops, the beginning of the data corresponding to pulses. By counting back from that active data point N locations, then skipping over M, counting back N, and skipping over M again, etc., the program can find out how far back it must count "hopping" before the remainder of the amount of delay will fit within the initial Entry Point address loading.

Viewed now going forward in time, the program loads an Entry Point address such that, when the lowest byte counter 122 reaches its terminal count, if the end of memory has not been reached, loading of the counter with the least significant bits of the Loop Back address will take it the rest of the way to the end of memory, hopping as necessary to get there, if the Loop Back address must be repeatedly reloaded to accomplish this end.

In the case of odd pulses associated with single byte loops, N=1 and M=15. That is, the "hops" are 15 bytes long and the portions of memory that are used are only one byte long. Therefore, the data representing any odd pulses is put 16 bytes before the last byte of memory, so that after the odd pulse data is read out of memory, the hop over 15 bytes means that the last byte is the next byte. Note that under these circumstances, the effective length of the 4k memory is only 256 bytes, two of which are taken up by pulse data, leaving only 254 bytes for the delay data. At the maximum frequency of 650 MHz, where the period is only 1.54 nanoseconds, the maximum net delay available is about 3.13 microseconds (1.54 ns×8 bits/byte×254 bytes), 2.0 microseconds of which are made available to the operator and the rest of which is reserved for internal calibration compensation.

The ±cycle adjust circuit 78 normally passes the serial data from the shift register 76 through without any delay as "lead", and also produces an inverted version of that data "trail". Either version may be delayed by one master clock cycle, however, when the delay lead or delay trail signals are active. Such a delay is necessary under some circumstances to be further described below.

Assuming for now that the signal top octave enable is inactive low, the output of AND gates 84 and 85 will be a constant low, and OR gate 82 and NOR gate 80 are responsive only to the lead and trail signals from the ±cycle adjust circuit 78. NOR gate 80 inverts the lead signal and applies it to analog delay element 86. OR gate 82 passes the trail signal to analog delay element 88. Analog delay elements 86 and 88 are controlled in the amount of delay that they provide by the outputs of lead vernier DAC 64 and trail vernier DAC 66, respectively. The outputs of analog delay elements 86 and 88 are received by digital delay elements 90 and 92, respectively.

Figure 6:
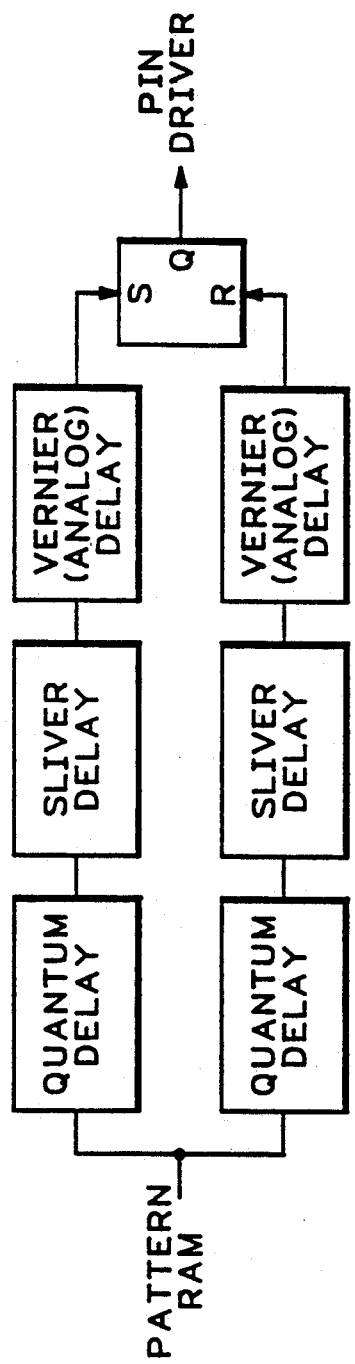

FIG. 6 is a explanatory diagram of how the pulse edges are delayed according to the present invention. The input from the pattern RAM provides the most coarse timing control, in that it has been delayed by some number of quanta and has a width and period that are each some number of quanta long. Either edge can be delayed by one additional quanta if required by the ±cycle adjust circuit 78 (FIG 3A). A quantum can vary in length between 1.54 nanoseconds at the highest operating frequency, 650 MHz, and 3.08 nanoseconds at the lowest frequency of the triggerable VCO, 325 MHz.

Digital "slivers", each roughly 200 picoseconds long, are available to permit an intermediate level of edge control. There are a total of 23 such slivers available, but sixteen are typically enough to cover one quantum at the maximum period of 3.09 nanoseconds. Finally, vernier control by the analog delay elements can move edges by amounts smaller than a picosecond. There are 256 vernier settings available from the vernier DACs 64 and 66. To summarize, there are enough vernier settings to adjust time over one sliver, and enough slivers to adjust time over a quantum. Consequently, there is always some combination of quanta, slivers, and vernier settings suitable for placing an edge wherever the user desires to within one picosecond of resolution. Refer to FIG. 9A, which conceptually shows (but not to scale) how slivers and verniers are added to quanta to produce any desired edge placement.

Figure 7:
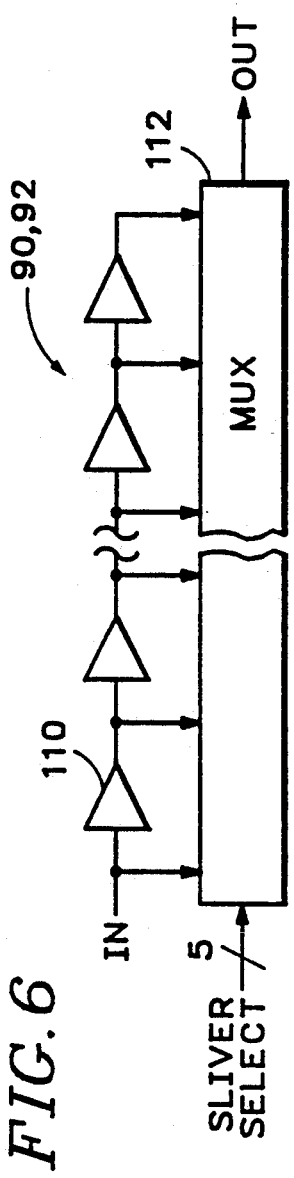
FIG. 7 is a partial schematic diagram of the digital delay elements used in the digital pulse generator of the present invention.

Referring now to FIG. 7, slivers are produced by passing the edge to be adjusted in time through a series of buffer amplifiers 110 and selecting the output of one of these buffer amplifiers via multiplexer 112. A device for performing this function is commercially available, in particular from Sony Corporation, as the CXB1139Q Programmable Delay Line / Duty Cycle Controller.

Figure 8B:
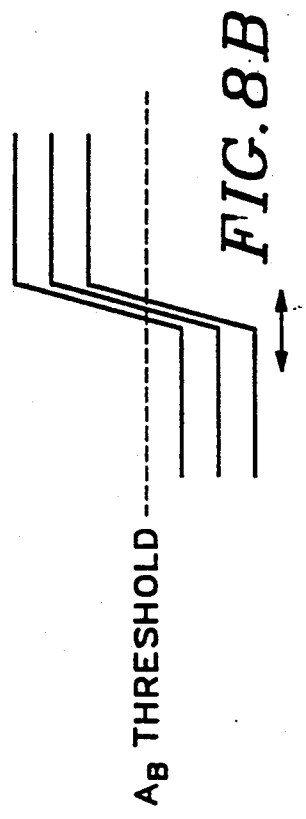
FIG. 8B is an illustration of the operation of the analog delay element shown in FIG. 8A.
Figure 8A:
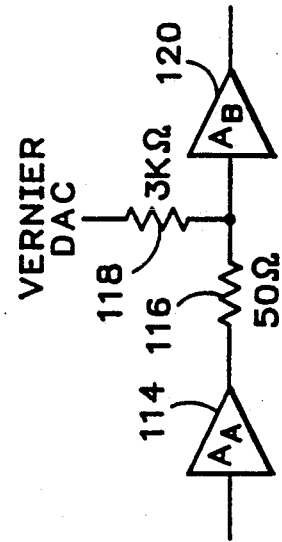
FIG. 8A is a schematic diagram of the analog delay elements used in the digital pulse generator of the present invention.

Referring now to FIG. 8A, vernier control is suitably achieved by applying differing vernier DAC voltages to the network shown. The output of amplifier A-a 114 is offset by a dc component determined by the vernier DAC voltage at the top of resistor 118. Referring now to FIG. 8B, changing this offset level changes the time at which the signal crosses the threshold of the next amplifier A-b 120 and, consequently, the exact timing of the signal from that point on.

Returning now to FIG. 3, a flip-flop 98 has a constant "1" on its D input and is clocked by the lead signal from the digital delay element 90. The inversion at the output of the digital delay element 90 cancels the inversion that occurred in passing through the NOR gate 80. Thus, the rising edge of the lead signal causes the output of flip-flop 98 to go high. The output of flip-flop 98 remains high until the flip-flop is reset by the signal from NOR gate 96 representing a falling edge on the trail signal.

The trail signal from digital delay element 92 is applied to one input of NOR gate 96, while an inverted and slightly delayed version of it is applied to the other input to NOR gate 96. The result is that, when trail goes low, the delayed version of it coming from 300 picosecond delay element 94 remains low for 300 picoseconds. Thus, NOR gate 96 applies a 300 picosecond reset pulse to flip-flop 98 upon the occurrence of the trailing edge of the trail signal. The reset pulse is kept short to prevent the next leading edge from getting lost when the operator has specified an output pulse with a very short low time. The reset pulse must be at least this long to satisfy the flip-flop manufacturer's specifications for minimum reset time to reliably reset the flip-flop 98. Because the flip-flop has another specification for the minimum time between release of the reset line and when it is ready for the next clock signal, the pulse generator of the present invention has a minimum recovery time specification of 800 picoseconds.

Relay 100 permits the operator to select the complement of the output signal instead of the signal itself. Relay 108 permits the instrument to be used only for its output pin driver circuit 102, i.e., transducer mode discussed above. Relays 104 and 106 permit either the signal or its complement to be disabled.

Referring now to FIG. 9B, to create pulses shorter than a quantum, but with a period that is more than a quantum long, the delay lead input to the ±cycle adjust circuitry 78 is set to produce a late lead signal. This produces a rising edge on lead that is coincident in time with the falling edge on trail. Slivers and verniers are then used to delay trail by the desired pulse width.

Referring now to FIG. 9C, to create pulses with a low-going interval that is shorter than one quantum, the delay trail signal input to the ±cycle adjust circuitry is set, causing a late trail signal to be produced. With delay trail set, the late trailing edge is falling at the same time that the normal leading edge is rising. Delaying the leading edge with slivers and verniers then produces a pulse whose low interval is only as long as this added delay. Of course, this low interval cannot be shorter than the minimum recovery time specification of 800 picoseconds discussed above.

The preceding discussion assumed that the instrument was not operating in its top octave of performance and that the signal top octave enable was inactive low. When frequencies above 325 MHz are selected by the operator, top octave enable is high and the operation of this circuitry is somewhat different, and is referred to as "straightthrough mode". With top octave enable high, master clock signals pass through AND gate 84 and are gated through AND 85 by the lead signal. That is, the pattern RAM 62 contents are now used to gate bursts of master clock signals through the lead path. See FIG. 9D. The master clock signals for OR gate 82 are not gated, but extra resets through the trail path have no effect, since flip-flop 98 will already be reset when they occur.

To achieve the desired accuracy in edge placement, the circuitry described above should be calibrated. The precise delay time associated with each tap position is measured. The analog delay sections are also evaluated to see how much delay they produce for each input voltage value. The absolute delay through each channel in the system is also determined and stored.

To measure the delays associated with each tap position in the digital tapped delay line ("sliver" machines) and the analog delay elements (verniers), these delay elements are first set to their minimum delay settings. A pattern is then placed in the pattern RAM 62 that is four ones high and four zeros low. Then, the on-board, low speed A/D converter 107 (FIG. 3) is used to measure the average output voltage, which will be very near the average of the high level and the low level. The pattern in the pattern RAM 62 is then changed to five high and three low, and the average voltage output measurement is repeated. The pattern is then changed to three low and five high, and the measurement repeated. These three measurements, one representing a duty factor of 3/8, another 4/8, and the third a duty factor of 5/8, along with the accuracy of the triggerable VCO 30, now permit the relationship between pulse width variation (delta-time) and average output voltage variation (delta-voltage) to be determined.

The pattern in the pattern RAM is then changed back to four high and four low, and the taps are used to move first one edge, and then the other edge, one tap at a time. By measuring the average voltage for each setting and using the delta-time to delta-voltage relationship derived above, the precise delay of each tap setting can be established and stored. The same procedure can be used to measure the delay of each vernier setting, or at least a representative set of them from which the others can be interpolated. As the MPU performs these measurements, it stores all of the results in a table, so that appropriate values can be selected to carry into effect future operator commands.

The precise calibration of pulse width, or lead-to-trail skew, can be accomplished by setting up a pulse to have a 50% (requested) duty factor using only an integral number of quanta. This is, all sliver and vernier adjustments are set to zero. The average voltage output is then measured. Then, the pulse is inverted using the complement relay and the average voltage output is measured again. If the results of both measurements are the same, the duty factor is precisely 50% and the lead-to-trail skew is zero. If the results are not the same, the lead-to-trail skew can be calculated using the delta-voltage to delta-time relationship established above and the value of this calculated constant stored as a calibration constant for that channel.

To align the absolute delays of the various pulse generation channels in the instrument, a different procedure is used. The calibration input on the timebase card is connected to the input of the skew calibration sampler 53. The skew calibration sampler is reset by reset done during initialization, and then takes a sample 128 TVCO clocks later. While this time is not adjustable, it is constant, so that with this determination and the adjustability of each channel, it is possible to precisely time align all of the outputs with each other and store the results.

The delay of each channel to be aligned is set to some low value so that a reference edge definitely precedes the calibration input sampling time. The delay is increased until the lowest delay value is found that is later than the sampling point. This delay is recorded as a calibration constant for that channel.

The unique digital architecture described above inherently produces pulses with very accurate tolerances, especially channel-to-channel tolerances. This is the case because all of the channels on all of the pulse cards 16 are synchronized to the same digital timebase generated by the triggerable VCO 30 on the timebase card 14. Thus, even if some timebase jitter occurs, the channel-to-channel tolerances do not suffer from it. Moreover, the automatic calibration system compensates for variations between channels and other system variables.

The fact that this unique digital architecture (minus the RAM 62) is also used in the trigger out machine 56 permits the accurate positioning of a trigger out signal, forward or backward in time, relative to any pulse. This architecture also allows the user to specify the trailing edge timing directly, if desired, rather than indirectly through a delay and a pulse width.

This new digital architecture, when controlled by appropriate software, also allows an operator to specify both pulse width and phase as a percentage of the overall period and rely on the pulse generator software to automatically keep. them proportional as the operator selects different frequencies. This is accomplished by storing pulse width information as a percentage of a pulse period and also storing the time within a pulse period before the high portion of the pulse (the width) is to begin as a percentage of the pulse period. Then, whenever there is an input command to change frequency, the MPU 12 responds automatically by calculating a new pulse width that is the stored percentage of the new pulse period and a new time within the new pulse period before the new pulse width is to begin that is the corresponding stored percentage of the new pulse period. These new values are then implemented using quanta, slivers, and verniers as necessary.

The frame sync input provides a means for controlling when bursts of pulses synchronized to an external frequency source will begin, by arming the phase locked triggerable VCO 30 via the burst control state machine 50 and the clock control signal to AND gate 52. The frame sync input is synchronized, as discussed above, by first the phase lock input and then the TVCO clock, to become the clock control signal, so that AND gate 52 is opened at the correct phase of the TVCO clock.

By putting different patterns in the RAM 62 of different channels, some channels can be made to run at slower frequencies than others, but still be synchronized with them. The slower frequencies can have any integral power-of-two relationship to the top frequency that can be described with a pattern that fits in RAM 62.

The operator can also disable a channel, but have it maintain a selectable dc voltage output level. This request is implemented by filling the RAM 62 of the pulse channel to be disabled with all ones or all zeros, depending on the voltage level desired, and setting the corresponding high level 68 or low level 70 DAC to the desired voltage.

And, the whole instrument is automatically self-calibrating, as has been described above, only requiring the operator to connect the outputs to the calibration input using the same piece of cable in order to accomplish the calibration.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

We claim:

1. A method for accurately controlling a time relationship between a generated output pulse and a reference time, the method comprising the steps of:
    deriving time quanta from a controllable timebase to produce a coarse time relationship between the generated output pulse and the reference time;
    adding digital slivers to modify the coarse time relationship to produce a modified time relationship; and
    adjusting the modified time relationship by analog vernier increments to produce an accurately controlled time relationship between the generated output pulse and the reference time.

2. A method according to claim 1 wherein the deriving step comprises the steps of:
    placing a pattern of data in a memory indicative of a desired coarse time relationship; and
    digitally converting the pattern of data into pulse edges according to the coarse time relationship.

3. A method according to claim 2 wherein the digitally converting step comprises the steps of:
    reading out from the memory parallel bytes of the pattern of data;
    converting the bytes of the pattern of data from parallel to serial to produce a serial data stream;
    dividing the serial data stream into an original data stream and an inverted data stream;
    employing the original data stream to control a timing of a first pulse edge; and
    employing the inverted data stream to control a timing of a second pulse edge.

4. A method according to claim 1 wherein the adding step comprises the steps of:
    passing a pulse edge of the generated output pulse having the coarse time relationship through a series of amplifiers to produce a plurality of pulse edges each delayed by an additional sliver; and
    selecting one of the plurality of pulse edges to produce a modified time relationship.

5. A method according to claim 1 wherein the ad step comprises the steps of:
    passing a pulse edge of the generated output pulse through a first amplifier and a second amplifier;
    adjusting a dc level between the first amplifier and the second amplifier to control a time that the pulse edge crosses a threshold of the second amplifier to produce an accurately controlled time relationship between the generated output pulse and the reference time.

6. A method for accurately controlling a time relationship between a generated output pulse and a trigger pulse output, the method comprising the steps of:
    deriving time quanta from a controllable timebase to produce a first coarse time relationship between a generated output pulse and a reference time, and to produce a second coarse time relationship between a trigger pulse output and the reference time;
    adding digital slivers to modify the first and second coarse time relationships to produce modified time relationships; and
    adjusting the modified time relationships by analog vernier increments to produce an accurately controlled time relationship between the generated output pulse and the trigger pulse output.

7. A method according to claim 6 wherein the deriving step comprises the steps of:
    placing a pattern of data in a memory indicative of a desired coarse time relationship; and
    digitally converting the pattern of data into pulse edges according to the coarse time relationship.

8. A method according to claim 7 wherein the digitally converting step comprises the steps of:
    reading out from the memory parallel bytes of the pattern of data;
    converting the bytes of the pattern of data from parallel to serial to produce a serial data stream;
    dividing the serial data stream into an original data stream and an inverted data stream;
    employing the original data stream to control a timing of a first pulse edge; and
    employing the inverted data stream to control a timing of a second pulse edge.

9. A method according to claim 6 wherein the adding step comprises the steps of:
    passing a pulse edge of the generated output pulse having the coarse time relationship through a series of amplifiers to produce a plurality of pulse edges each delayed by an additional sliver; and selecting one of the plurality of pulse edges to produce a modified time relationship.

10. A method according to claim 6 wherein the adjusting step comprises the steps of:
passing a pulse edge of the generated output pulse and the trigger pulse through a first amplifier and a second amplifier;
adjusting a dc level between the first amplifier and the second amplifier to control a time that the pulse edge crosses a threshold of the second amplifier to produce an accurately controlled time relationship between the generated output pulse and the trigger output pulse.

* * * * *